United States Patent
Boyd et al.

(10) Patent No.: US 9,245,818 B2
(45) Date of Patent: Jan. 26, 2016

(54) INTEGRATED ASSEMBLY FOR INSTALLING INTEGRATED CIRCUIT DEVICES ON A SUBSTRATE

(71) Applicants: Thomas A. Boyd, North Plains, OR (US); Michael Z. Eckblad, Auburn, WA (US)

(72) Inventors: Thomas A. Boyd, North Plains, OR (US); Michael Z. Eckblad, Auburn, WA (US)

(73) Assignee: INTEL CORPORATION, Santa Clara, CA (US)

( * ) Notice: Subject to any disclaimer, the term of this patent is extended or adjusted under 35 U.S.C. 154(b) by 187 days.

(21) Appl. No.: 13/631,743

(22) Filed: Sep. 28, 2012

(65) Prior Publication Data

US 2014/0092547 A1    Apr. 3, 2014

(51) Int. Cl.
*H05K 7/12*    (2006.01)
*H01L 23/40*   (2006.01)
*H05K 3/30*    (2006.01)

(52) U.S. Cl.
CPC ............ *H01L 23/4093* (2013.01); *H05K 3/301* (2013.01); *H05K 7/12* (2013.01); *H01L 2924/0002* (2013.01); *H05K 2201/10325* (2013.01); *H05K 2203/167* (2013.01); *Y10T 29/49124* (2015.01)

(58) Field of Classification Search
CPC ............ H05K 7/06; H05K 3/00; H05K 7/12; H05K 3/301; G06F 1/16; H01L 23/4093
USPC ...................... 439/311; 361/783, 747, 679.32
See application file for complete search history.

(56) References Cited

U.S. PATENT DOCUMENTS

| | | | |
|---|---|---|---|
| 7,083,456 B2 | 8/2006 | Trout et al. | |
| 7,371,100 B1 | 5/2008 | Polnyi | |
| 7,699,637 B2 * | 4/2010 | Yeh | 439/331 |
| 7,824,188 B2 * | 11/2010 | Yokoyama | 439/73 |
| 7,826,229 B2 * | 11/2010 | Cromwell et al. | 361/719 |
| 7,867,006 B2 * | 1/2011 | Yeh | 439/331 |
| 8,052,451 B2 * | 11/2011 | Yeh | 439/331 |
| 8,439,693 B2 * | 5/2013 | Yeh et al. | 439/135 |
| 2004/0018755 A1 * | 1/2004 | Ma | 439/73 |
| 2005/0111191 A1 * | 5/2005 | Lee et al. | 361/704 |
| 2005/0160592 A1 * | 7/2005 | Eckblad et al. | 29/832 |
| 2006/0022335 A1 * | 2/2006 | Kao | 257/727 |
| 2006/0056152 A1 * | 3/2006 | Li et al. | 361/697 |
| 2008/0081489 A1 | 4/2008 | MacGregor et al. | |
| 2008/0220643 A1 | 9/2008 | Zhang | |
| 2008/0280474 A1 * | 11/2008 | Fan et al. | 439/266 |
| 2009/0021917 A1 | 1/2009 | Floyd et al. | |

(Continued)

OTHER PUBLICATIONS

Ikea, "Ikea Cam Lock", dated prior to prior to Sep. 28, 2012, 1 pp.

(Continued)

*Primary Examiner* — Hoa C Nguyen
*Assistant Examiner* — Keith Depew
(74) *Attorney, Agent, or Firm* — Konrad Raynes Davda & Victor LLP

(57) ABSTRACT

In one embodiment, a biasing device is actuated using an actuator which is aligned with the biasing device along an alignment axis. A first frame is thereby biased toward a second frame along the alignment axis to bias an integrated circuit package toward a socket. The actuator also latches the first and second frames together and biased towards each other with the integrated circuit package and the socket biased toward each other. Other aspects and features are also described.

13 Claims, 15 Drawing Sheets

(56) References Cited

U.S. PATENT DOCUMENTS

| | | | |
|---|---|---|---|
| 2009/0197454 A1 | 8/2009 | Liao | |
| 2009/0203245 A1* | 8/2009 | Chiang | 439/331 |
| 2010/0093201 A1* | 4/2010 | Yeh | 439/330 |
| 2010/0120268 A1* | 5/2010 | Yeh | 439/68 |
| 2010/0184314 A1* | 7/2010 | Yeh | 439/157 |
| 2010/0330824 A1 | 12/2010 | Ulen et al. | |
| 2011/0157833 A1* | 6/2011 | Bohannon et al. | 361/709 |
| 2011/0294330 A1* | 12/2011 | Dai | 439/331 |
| 2012/0156913 A1 | 6/2012 | Haswarey et al. | |
| 2012/0156919 A1* | 6/2012 | Yeh et al. | 439/370 |
| 2012/0162923 A1* | 6/2012 | Lee et al. | 361/719 |
| 2013/0078827 A1* | 3/2013 | Yeh et al. | 439/76.1 |
| 2014/0071647 A1* | 3/2014 | Bridges et al. | 361/783 |
| 2014/0092573 A1 | 4/2014 | Llapitan et al. | |

OTHER PUBLICATIONS

Ikea, "Ikea Cam Lock and Screw", dated prior to prior to Sep. 28, 2012, 1 pp.

Intel Corporation, "Intel Core i7-900 Desktop Processor Extreme Edition Series and Intel Core i7-900 Desktop Processor Series and LGA1366 Socket", Thermal and Mechanical Design Guide, Mar. 2011, 72 pp.

Intel Corporation, "Intel Xeon Processor7500 Series Intel Xeon Processor E7-88001480012800 Product Families", Thermal and Mechanical Design Guide, Apr. 2011, 102 pp. [Submitted in two parts to make compatible with USPTO file size restrictions].

Office Action 1 for U.S. Appl. No. 13/631,806, dated Jan. 30, 2015, 17 pp.

Response to Office Action 1 for U.S. Appl. No. 13/631,806, dated Apr. 30, 2015, 13 pp.

Final Office Action 1 for U.S. Appl. No. 13/631,806, dated May 19, 2015, 17 pp.

First Response to Final Office Action 1 for U.S. Appl. No. 13/631,806, dated Jul. 20, 2015, 14 pp.

Second Response to Final Office Action 1 for U.S. Appl. No. 13/631,806, dated Aug. 18, 2015, 16 pp.

Haq, M.N., "Tukwila EC Design", Intel Presentation, Doc last saved Sep. 7, 2012, 17 pp.

Office Action 3 for U.S. Appl. No. 13/631,806, dated Nov. 2, 2105, 19 pp.

\* cited by examiner

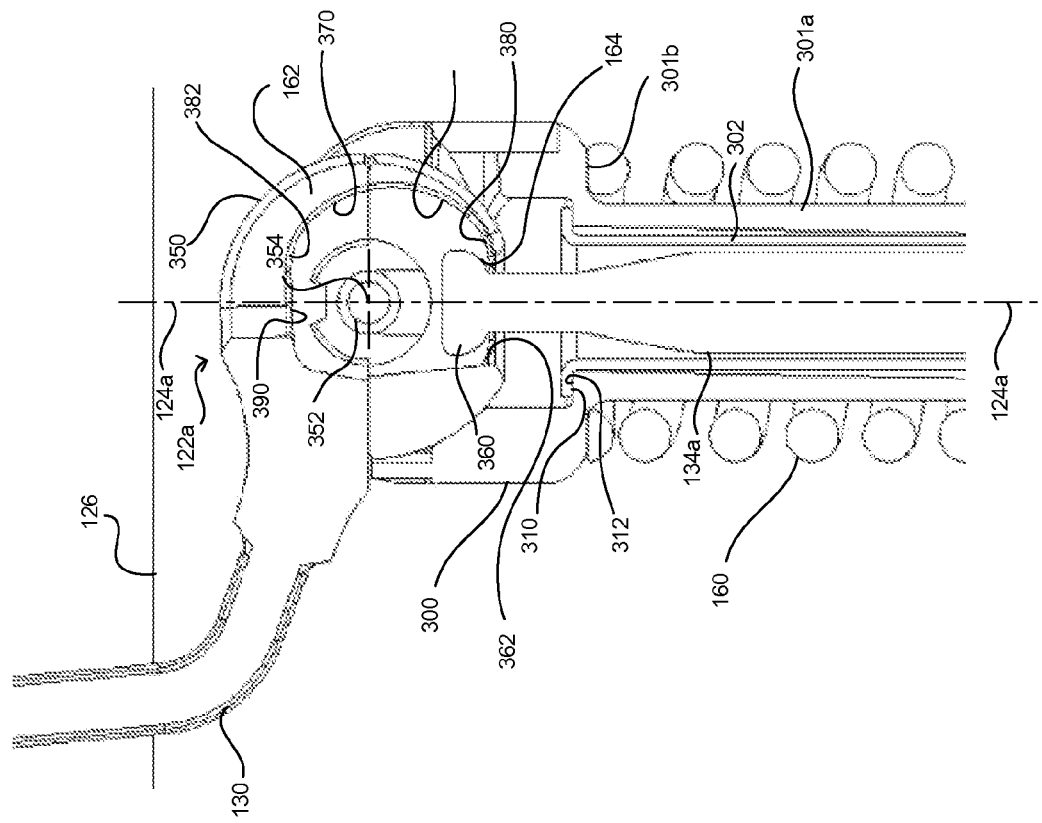
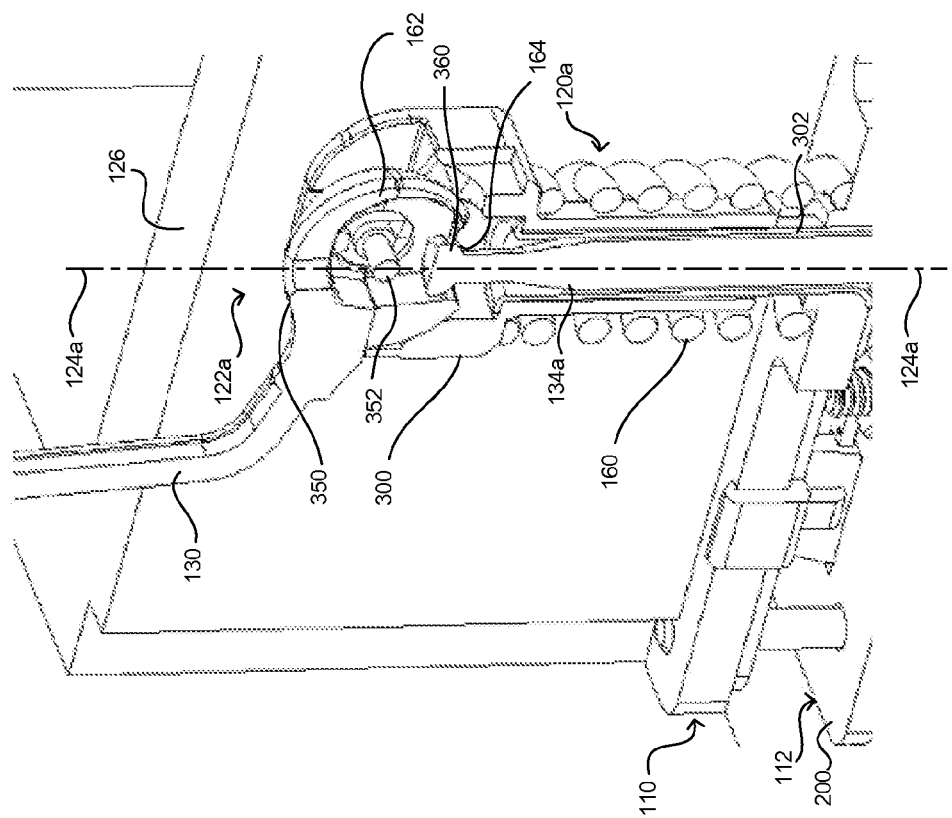
FIG. 11b
FIG. 11a

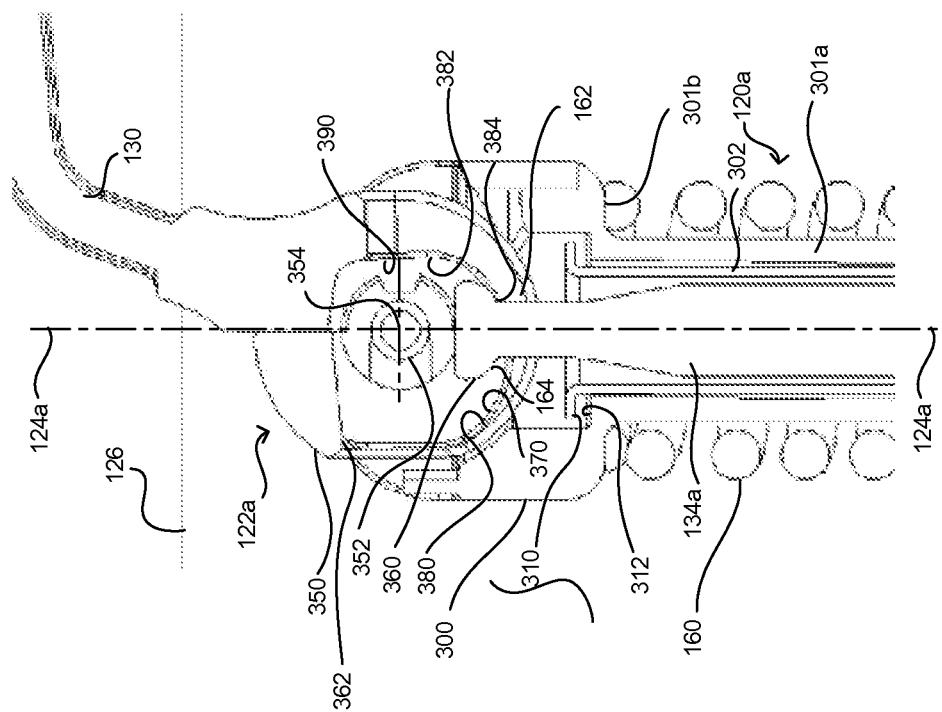
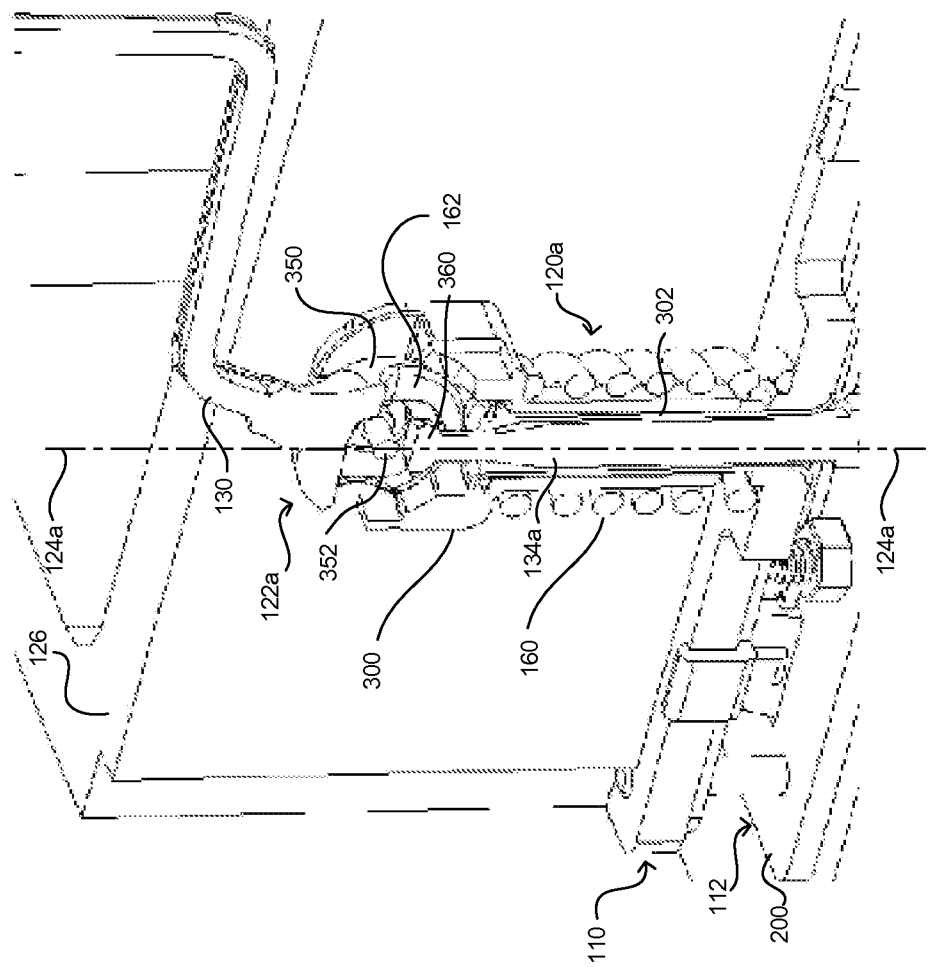

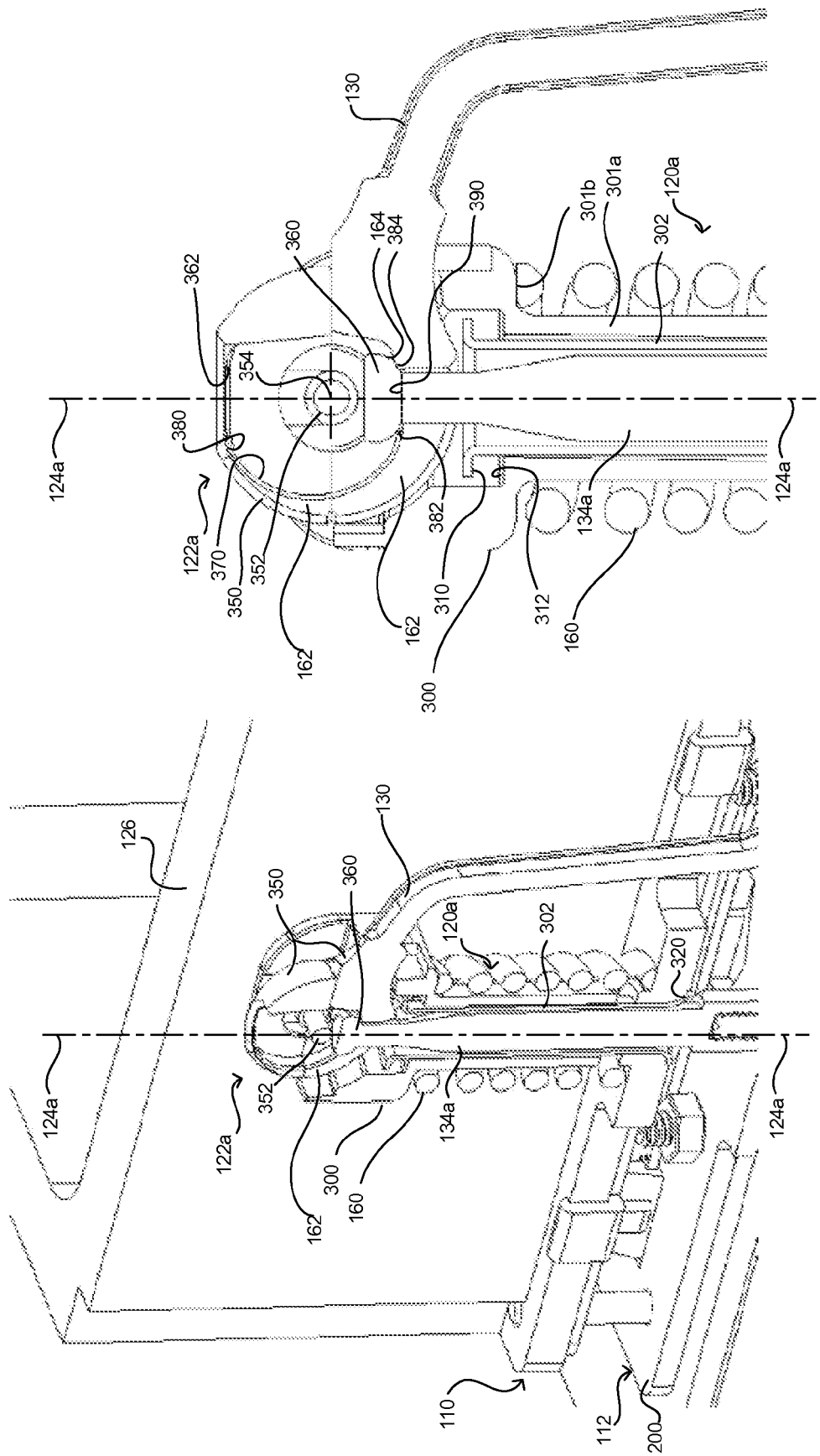

INTEGRATED ASSEMBLY FOR INSTALLING INTEGRATED CIRCUIT DEVICES ON A SUBSTRATE

BACKGROUND

Description of Related Art

Integrated circuits typically include various active and passive circuit elements which have been integrated into a piece of semiconductor material, often referred to as a die. The die may, in turn, be encapsulated into a package, which often includes a ceramic or plastic substrate although other materials may be used. These packages are usually physically attached to a printed circuit board or other substrate.

Integrated circuit packages frequently generate a large amount of heat. Accordingly, the larger integrated circuit packages for large integrated circuits such as processors typically have a thermal device such as a heat sink installed on an outer surface of the integrated circuit package to draw heat energy from the integrated circuit package to cool the integrated circuits of the package.

Printed circuit boards frequently include a socket or other receptacle in which the integrated circuit package is inserted. The socket typically includes a large number of electrical contacts which engage corresponding electrical contacts on the exterior of the integrated circuit package to electrically interconnect circuits within the integrated circuit package with other circuits mounted on or embedded within the printed circuit board. The electrical contacts include for example, pin grid arrays (PGA), ball grid arrays (BGA) and land grid arrays (LGA).

The electrical contacts of the socket and the integrated circuit package are frequently very large in number. Accordingly, the contacts tend to be relatively small and therefore relatively fragile and susceptible to damage, particularly when the integrated circuit package is installed in the socket by hand. Also, due to the large number, the contacts are often arranged in large arrays with relatively little space between the individual contacts. Hence, proper alignment between the contacts of the integrated circuit package and the socket is frequently a challenge.

Various devices have been proposed for loading the integrated circuit package into a socket. Other devices have been proposed for securely latching the integrated circuit package once placed within the socket. Some devices, often referred to as an integrated assembly, are intended for both functions, that is, both loading the integrated circuit package into the socket and latching it in place. In some applications, the heat sink is installed on the integrated circuit package after the integrated circuit package is installed in the socket. In others, a loading device is intended to facilitate installation of a preassembly of both the integrated circuit and the heat sink at the same time.

BRIEF DESCRIPTION OF THE DRAWINGS

Referring now to the drawings in which like reference numbers represent corresponding parts throughout:

FIGS. 11a and 11b are partial cross-sectional views, depicting an actuator of the integrated circuit package stack of FIG. 2 prior to actuating a biasing device of the integrated circuit package stack of FIG. 2;

FIGS. 14a and 14b are partial cross-sectional views, depicting an actuator of the integrated circuit package stack of FIG. 2 actuating a biasing device of the integrated circuit package stack of FIG. 2;

FIGS. 15a and 15b are partial cross-sectional views, depicting an actuator of the integrated circuit package stack of FIG. 2 in a latched position after actuating a biasing device of the integrated circuit package stack of FIG. 2;

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1:
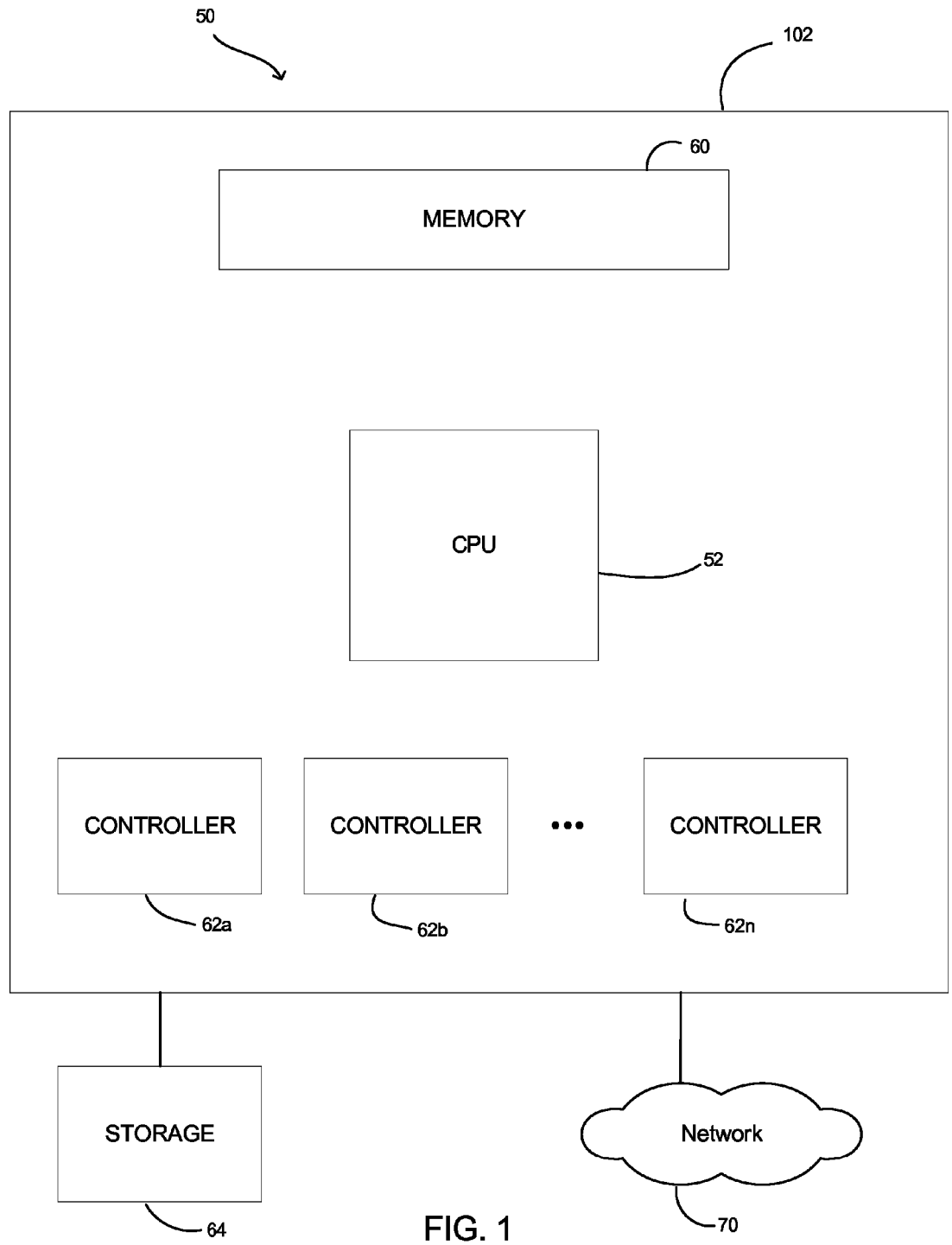
FIG. 1 illustrates one embodiment of a computing environment in which aspects of the description provided herein may be embodied.

FIG. 1 illustrates a computing environment in which aspects of described embodiments may be embodied. A computer 50 includes one or more central processing units (CPU) 52 (only one is shown), a memory 60 and a plurality of controllers 62a, 62b . . . 62n. Each of the CPU 52, memory 60 and controllers 62a, 62b . . . 62n include one or more electronic devices. One such electronic device is represented by an electronic device 100 (FIG. 2) which is electrically and mechanically coupled to a printed circuit board 102.

Figure 3:
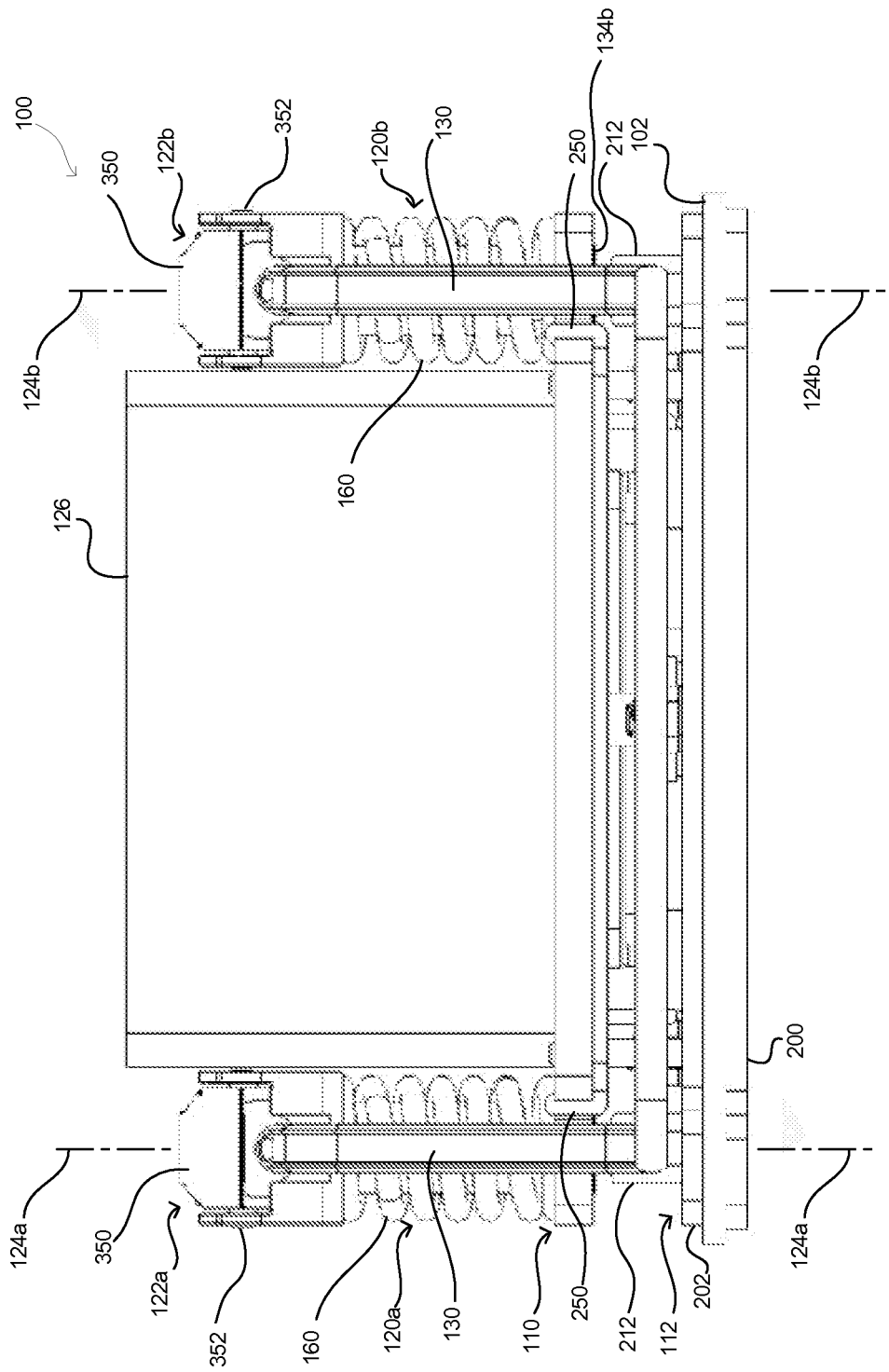
FIG. 3 illustrates a front view of the installed integrated circuit package stack of FIG. 2.
Figure 4:
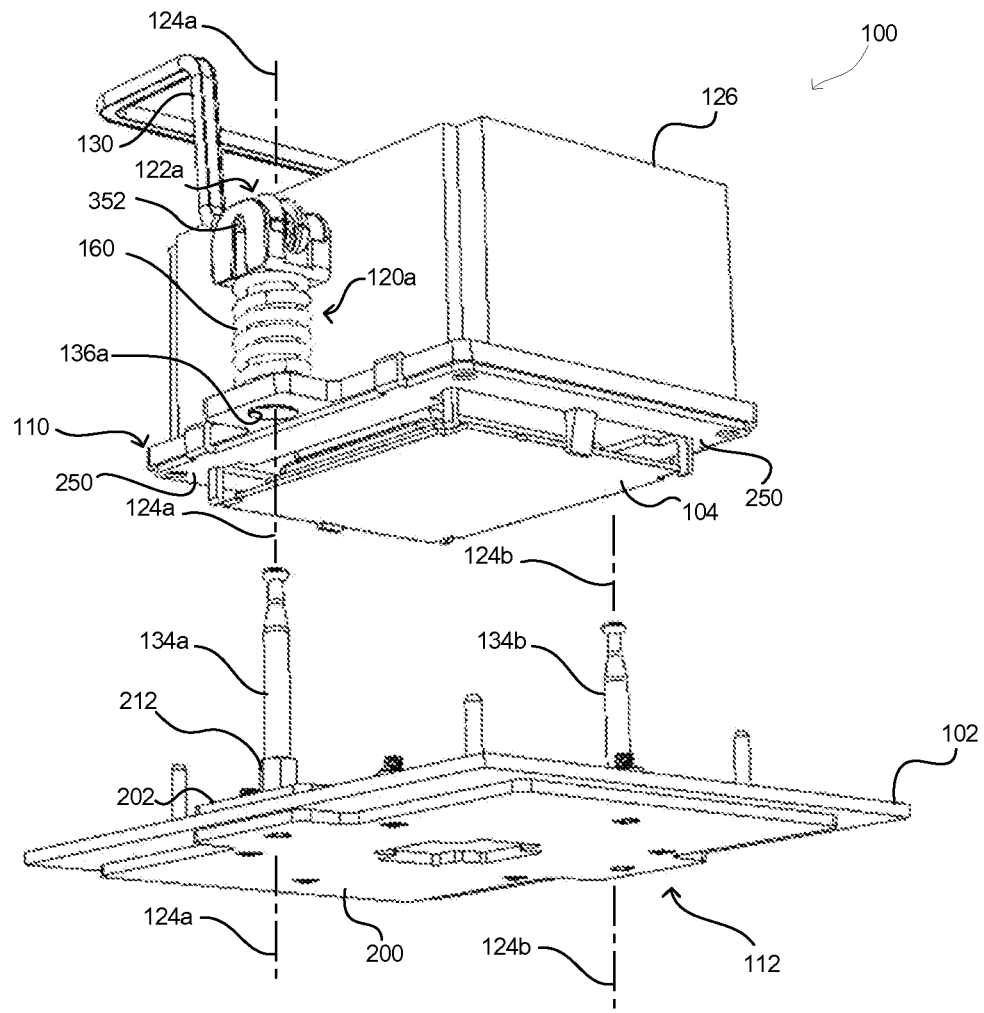
FIG. 4 illustrates the integrated circuit package stack of FIG. 2 prior to the integrated circuit package of the stack being loaded into a socket on a printed circuit board.
Figure 5:
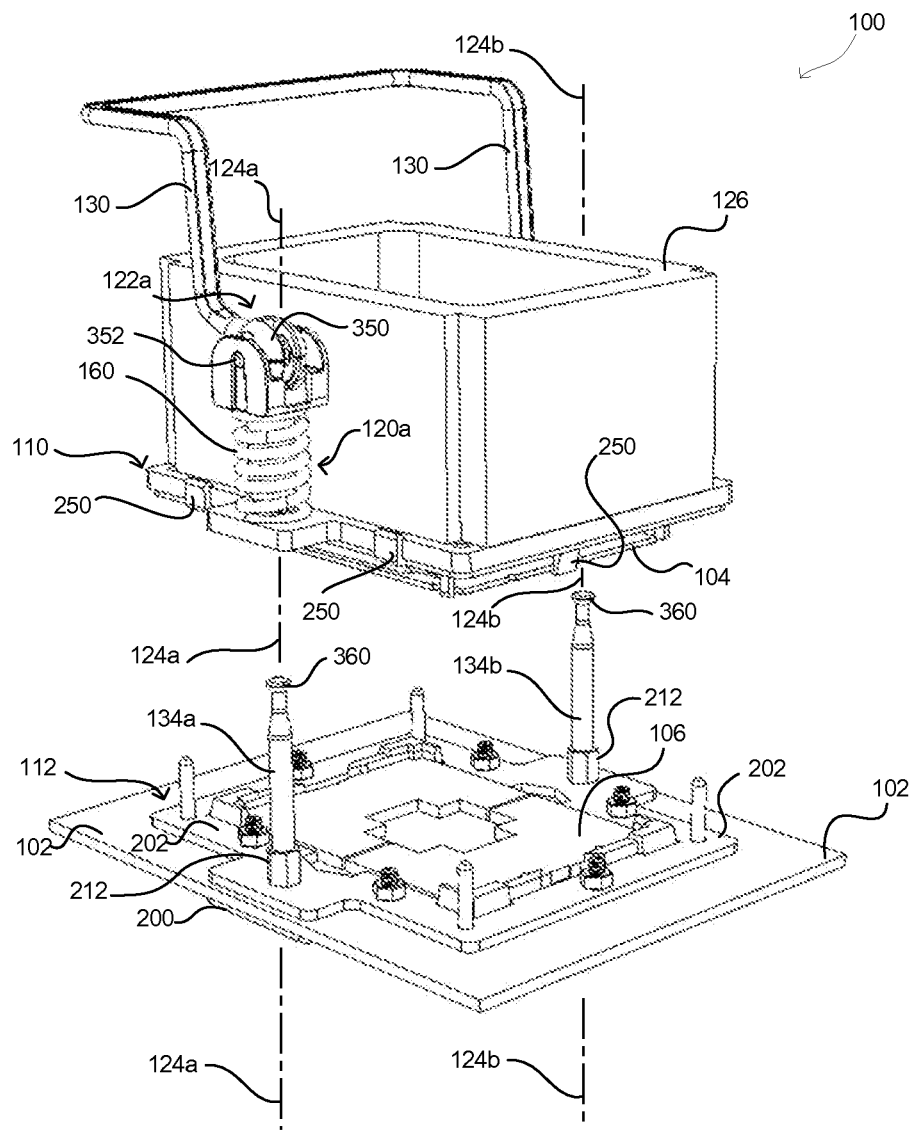
FIG. 5 illustrates another view of the integrated circuit package stack of FIG. 2 prior to the integrated circuit package of the stack being loaded into a socket on a printed circuit board.

The device 100 of this embodiment includes a stack comprising an integrated circuit package 104 (best seen in the partial assembly view of FIG. 4), which is received in a socket 106 (best seen in the partial assembly view of FIG. 5). The integrated circuit package 104 and socket 106 are compressed together between a first frame 110 (FIG. 2) and a second frame 112 by a pair of biasing devices 120a, 120b (FIG. 3), and by a pair of actuators 122a, 122b (FIG. 3). The first frame 110 is aligned with the second frame 112 along a pair of alignment axes 124a, 124b (FIG. 3) extending from the second frame 112 to the first frame 110. It is appreciated that the first and second frames 110, 112 may have other shapes, depending upon the particular application.

In accordance with one aspect of the present description, the biasing device 120a is actuated using the actuator 122a which is aligned with the biasing device 120a along the alignment axis 124a, to bias the first frame 110 toward the second frame 112 along the alignment axis 124a and to bias the integrated circuit package 104 toward the socket 106. Similarly, the biasing device 120b is actuated using the actuator 124b which is aligned with the biasing device 120b along the alignment axis 124b, to bias the first frame 110 toward the second frame 112 along the alignment axis 124b and to bias the integrated circuit package 104 toward the socket 106. The actuators 122a, 122b are also latches 122a, 122b which latch the first and second frames 110, 112, together and biased towards each other, applying a force commensurate with the size and preload of the biasing devices 120a, 120b, with the integrated circuit package 104 and the socket 106 biased toward each other.

In the illustrated embodiment, the alignment axes 124a, 124b are defined by a pair of alignment posts 134a, 134b (FIG. 4). Although the illustrated embodiment depicts a pair of biasing devices 120a, 120b, a pair of alignment posts 134a, 134b, and a pair of actuators 122a, 122b, it is appreciated that in some embodiments, there may be more or fewer biasing devices, alignment posts and associated actuators, depending upon the particular application.

It is believed that such an arrangement may, in some applications, facilitate loading and installing a heat sink and an integrated circuit package into a socket on a printed circuit board, in an aligned and latched position, without tools, using a single hand, and with reduced motions by a human or robotic installer. It is further believed that inadvertent damage to contacts of the integrated circuit package or socket may be reduced as well. Other features may be realized in addition to or instead of these features described herein, depending upon the particular application.

The printed circuit board 102 may be a single layer or multi-layered motherboard which has a plurality of conductive lines that provide communication between the circuits in the device 100 and other components mounted to the board 102. Alternatively, one or more of the CPU 52, memory 60 and controllers 62a, 62b . . . 62n may be disposed on other substrates such as daughter cards, expansion cards, package substrates, etc.

An operating system and various applications execute on the CPU 52 and reside in the memory 60. The content residing in memory 60 may be cached in accordance with known or subsequently developed caching techniques. Programs and data in memory 60 may be swapped into storage 64 as part of memory management operations. The computer 50 may comprise any computing device known in the art or subsequently developed, such as a mainframe, server, personal computer, workstation, laptop, handheld computer, telephony device, network appliance, virtualization device, storage controller, network controller, etc. Any suitable CPU 52 and operating system known in the art or subsequently developed, may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of storage protocols presently known or subsequently developed. Data being written to or read from the storage 62 may be cached in accordance with known or subsequently developed caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art or subsequently developed.

Figure 6:
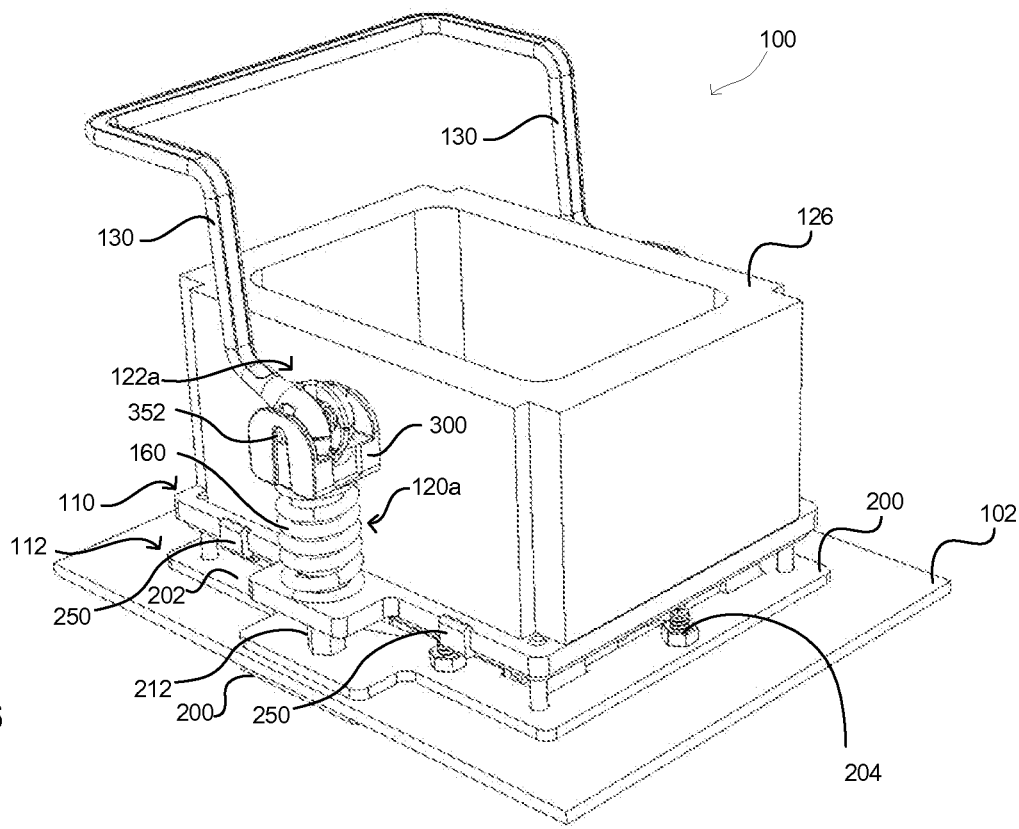
FIG. 6 illustrates the integrated circuit package stack of FIG. 2 prior to latching the stack in the installed position.

In another aspect of the present description, both actuators 122a, 122b are rotatable and may be actuated at the same time. In the illustrated embodiment, both actuators 122a, 122b may be readily actuated at the same time by pivoting a pivotable generally U-shaped lever 130 (FIG. 6) coupled to both the actuators 122a, 122b to rotate and actuate both the actuators 122a, 122b in unison as the lever 130 pivots. In this manner, the integrated circuit package 104 and the heat sink 126 may be biased toward the socket 106 and latched in position with few or a reduced number of motions by the installer.

In the illustrated embodiment, first frame 110 has a heat sink 126 to which the integrated circuit package 104 is coupled. In addition, the second frame 112 and a socket 106 are secured to the printed circuit board 102 or other supporting substrate. Hence, in one embodiment, alignment of the first frame 110 to the second frame 112 can result in alignment of the integrated circuit package 104 to the socket 106 as well.

It is appreciated that in some embodiments, one or both of the heat sink or socket may not be present. For example, in some applications, an integrated circuit package may be installed directly onto contacts on a printed circuit board or other substrate, without an associated socket. Thus, the integrated circuit package 104 may be biased by the actuators toward the printed circuit board 102 or other substrate and latched in the aligned position on the printed circuit board 102 without an intervening socket 106.

In another aspect, the first frame 110 is aligned to the second frame 112 by lowering the first frame 110 toward the second frame 112 so that alignment posts 134a, 134b (FIG. 4) which extend from the second frame 112, are inserted into alignment openings 136a, 136b (FIG. 3), respectively, defined by the first frame 110. As best seen in the partial cross-sectional view of FIGS. 7, 10a-10c, each alignment post 134a, 134b, as depicted for the alignment post 134a, has a tapered alignment surface 140. Similarly, the each alignment opening 136a, 136b as depicted for the alignment opening 136a, has a tapered alignment surface 142 which is engaged by the tapered alignment surface 140 as the alignment posts 134a, 134b (FIG. 4) which extend from the second frame 112, are inserted into alignment openings 136a, 136b of the first frame 110. Due to the tapering of the alignment surfaces 140, 142, the alignment between the first frame 110 and the second frame 112 may initially be relatively coarse and becomes progressively finer as the first frame 110 continues to the installed position depicted in FIG. 7. In this manner, the first frame 110 and the second frame 112 may be precisely aligned with respect to each other, resulting in precise alignment of the integrated circuit package 104 and the socket 106, as well.

Figure 8:
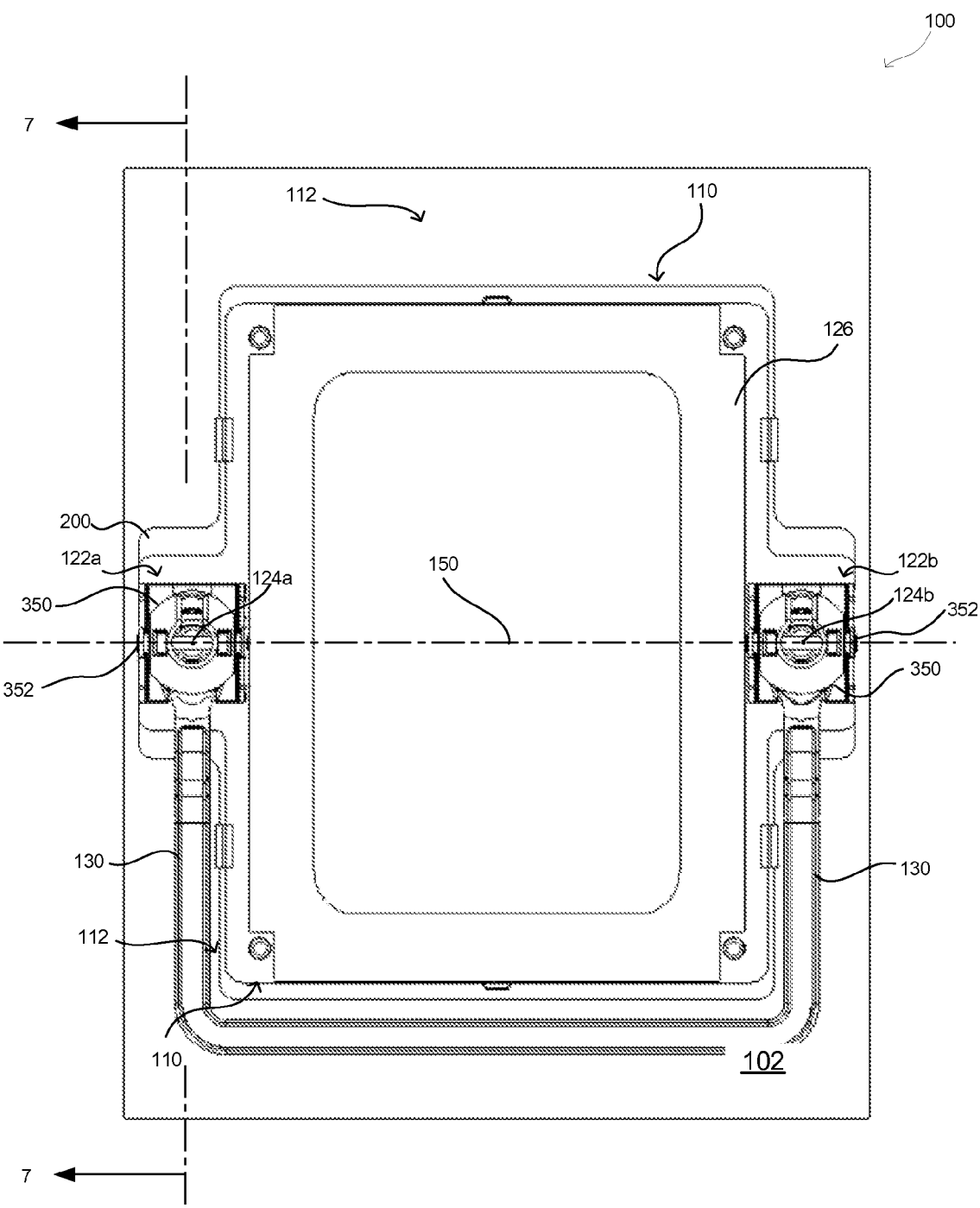
FIG. 8 illustrates a top view of the integrated circuit package stack of FIG. 2 shown latched in the installed position.

In the illustrated embodiment, the first frame 110 and its associated heat sink 126 define a bi-lateral center line 150 as best seen in the top view of FIG. 8. In the illustrated embodiment, the bi-lateral center line 150 defines a center line of the first frame 110 and thus divides the first frame 110 into two generally, bilaterally symmetric portions of similar size, shape and mass. In yet another aspect of the present description, the first and second alignment axes 124a, 124b are transverse to and aligned with (that is, pass through) the bi-lateral center line 150 of the first frame 110 when the first frame 110 and its associated integrated circuit package 104, are aligned with the second frame 112 and its associated socket 106 carried on the printed circuit board 102 or other substrate, along the respective first and second alignment axes 124a, 124b extending from the second frame 112 to the first frame 110. Accordingly, the compression forces applied to the first frame 110 by the actuators 122a, 122b and biasing devices 120a, 120b, along the alignment axes 124a, 124b are distributed substantially equally to the two bilaterally symmetric portions defined by the bi-lateral center line 150.

In still another aspect, in the illustrated embodiment, each biasing device 120a, 120b includes a spring 160 (FIG. 2) such as a helix spring, for example, which is positioned between the associated actuator 122a, 122b and the first frame 110. Each spring 160 is coaxially aligned with the associated alignment axis 124a, 124b. In addition, in the illustrated embodiment as best seen in the cross-sectional views of FIG. 7 (as viewed along the lines 7-7 in FIG. 8) and FIG. 14b, each actuator 122a, 122b has a rotatable wedge-shaped body 162. As the actuator 122a is rotated, its associated wedge-shaped body 162 engages a shoulder surface 164 defined by the associated alignment post 134a, to compress the associated spring 160 of the associated biasing device 120a, which biases the first frame 110 on the side depicted in FIG. 7, toward the second frame 112 and biases the integrated circuit 104 toward the socket 106. The actuator 122b and its associated biasing device 120b operate in a similar manner as the actuator 122b is rotated.

In the illustrated embodiment, the second frame 112 includes a lower plate 200 (best seen in FIG. 4) which is secured to the underside of the printed circuit board 102. In addition, the second frame 112 includes an upper plate 202 (best seen in FIG. 5) which is secured to the upper side of the printed circuit board 102. The plates 200, 202 may be secured to the printed circuit board 102 using any suitable mechanical fasteners, adhesives or other bonding elements. The socket 106 is secured and electrically coupled to the printed circuit board 102 within an aperture of the upper plate 202, by soldering, for example. Other bonding techniques may be used, depending upon the particular application. In the illustrated embodiment, the plates 200, 202 may be secured to each other using screw and nut fasteners 204 which pass through the printed circuit board 102, compressing the printed circuit board 102 between the lower and upper plates, 200, 202 of the second frame 112. Although the second frame 112 is depicted as including two plates, it is appreciated that in other embodiments, the frame 112 may have fewer or more plates or structures, depending upon the particular application.

Figure 7:
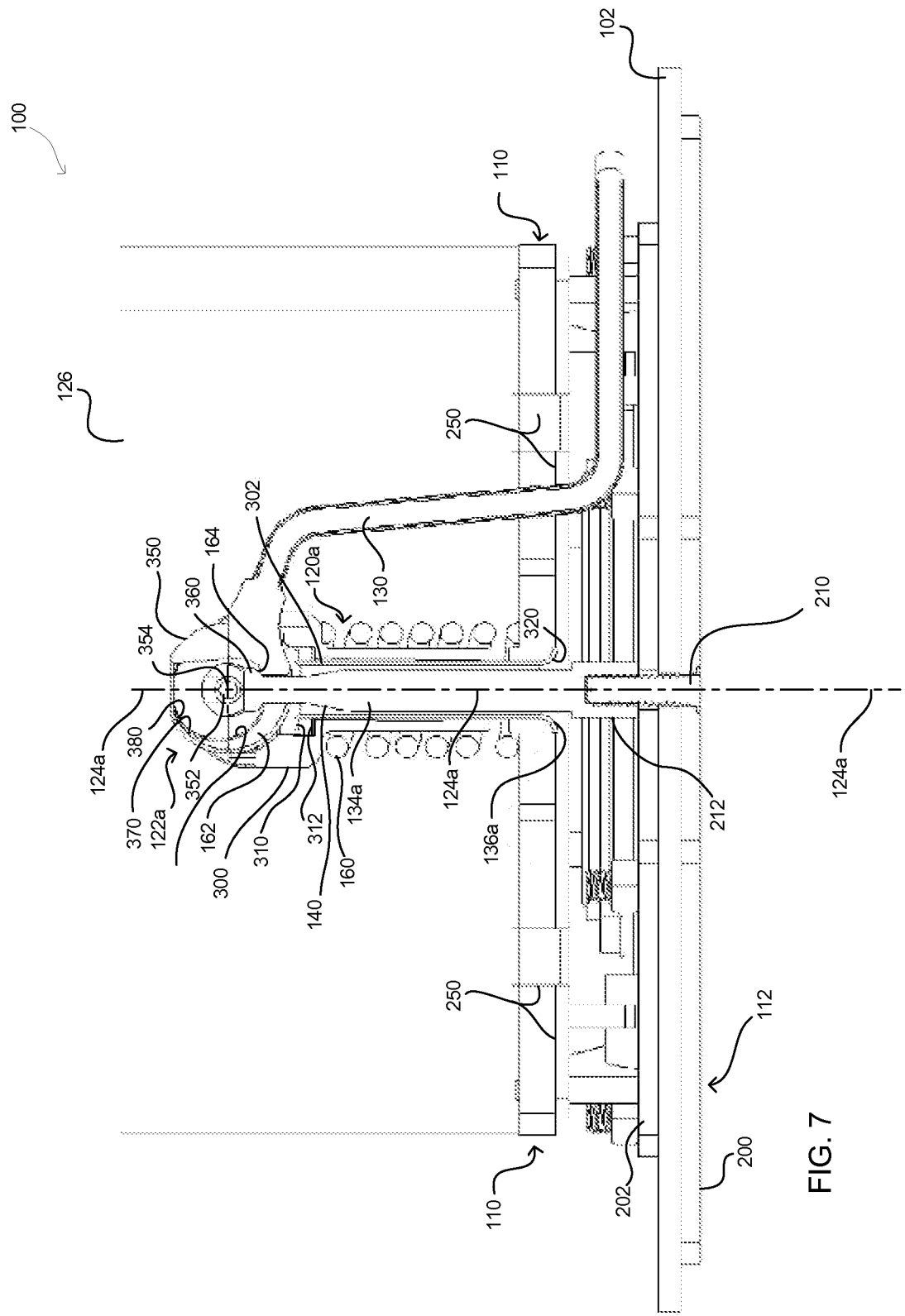
FIG. 7 illustrates a side, cross-sectional view of the installed integrated circuit package stack of FIG. 2, as viewed along the lines 7-7 of FIG. 8, and shown latched in the installed position.

As best seen in the partial cross-sectional view of FIG. 7, the alignment post 134a which defines the alignment axis 124a is secured to the upper surface of the upper plate 202 of the second frame 112 in an upstanding position using a threaded screw fastener 210 which passes through suitable openings in the lower plate 200, the printed circuit board 102 and the upper plate 202. The threaded fastener 210 is threadably received in a threaded opening in the base 212 of the alignment post 134a. It is appreciated that the alignment post 134a may be secured to the second frame 112 using any suitable fastener or bond. Although the alignment post 134a is depicted as being attached to the second frame 112, it is appreciated that in some embodiments, the alignment post 134a may be integrally formed with the second frame 112. The alignment post 134b may be formed with or secured to the second frame 112 in a similar manner.

Figure 9:
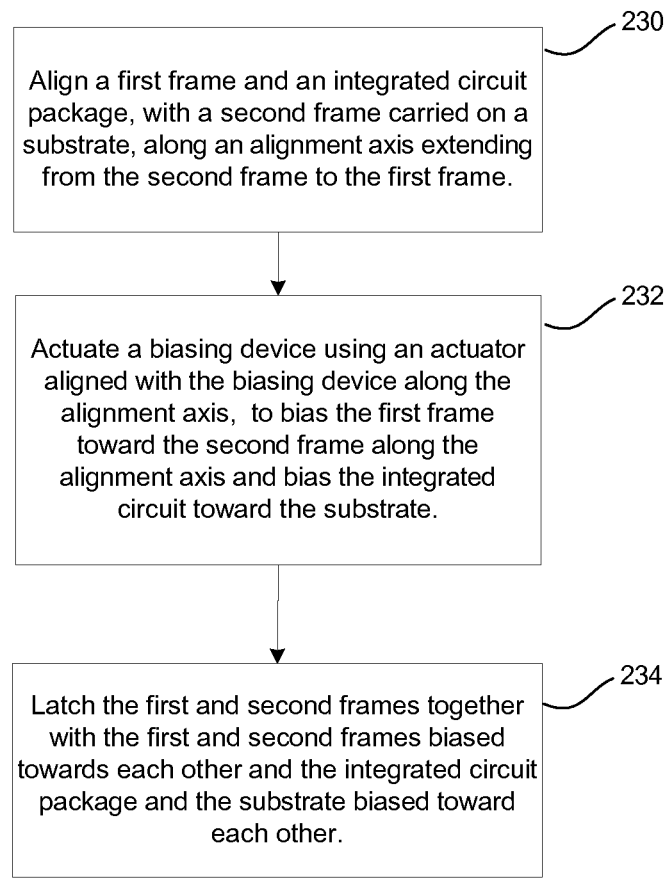
FIG. 9 depicts one example of operations for installing an integrated circuit package on a printed circuit board or other substrate, in accordance with one embodiment of the present description.

FIG. 9 depicts one example of operations for installing an integrated circuit package on a printed circuit board or other substrate, in accordance with one embodiment of the present description. In one operation, a first frame such as the first frame 110 is aligned (block 230) with a second frame, such as the second frame 112, carried on a substrate such as the printed circuit board 102, along one or more alignment axes such as the alignment axes 134a, 134b extending from the second frame to the first frame.

In the illustrated embodiment, an integrated circuit package, such as the integrated circuit package 104, is preassembled to the first frame 110 as shown in FIG. 4, for example, before the first frame is mated with the second frame 112. For example, the integrated circuit package 104 may be clipped to the bottom of the first frame 110 using a suitable clip frame 250 which temporarily secures to integrated circuit package in an aligned position on the bottom of the first frame 110. Thus, by aligning the integrated circuit package 104 to the first frame 110, the integrated circuit package 104 will also be aligned with respect to the socket 106 and the second frame 112, when the first frame 110 is aligned to the second frame 112.

A suitable thermal paste or other heat transfer medium may be applied between the integrated circuit package 104 and the heat sink 126 of the first frame to facilitate the transfer of heat energy from the integrated circuit package to the heat sink 126 during operation of the integrated circuit package 104. Other techniques may be used to preassemble the integrated circuit package 104 to the first frame 110 depending upon the particular application. In other embodiments, the integrated circuit package may be placed in the socket 106 before the first frame 110 is mated with the second frame 112.

Figures 10A, 10B, 10C:
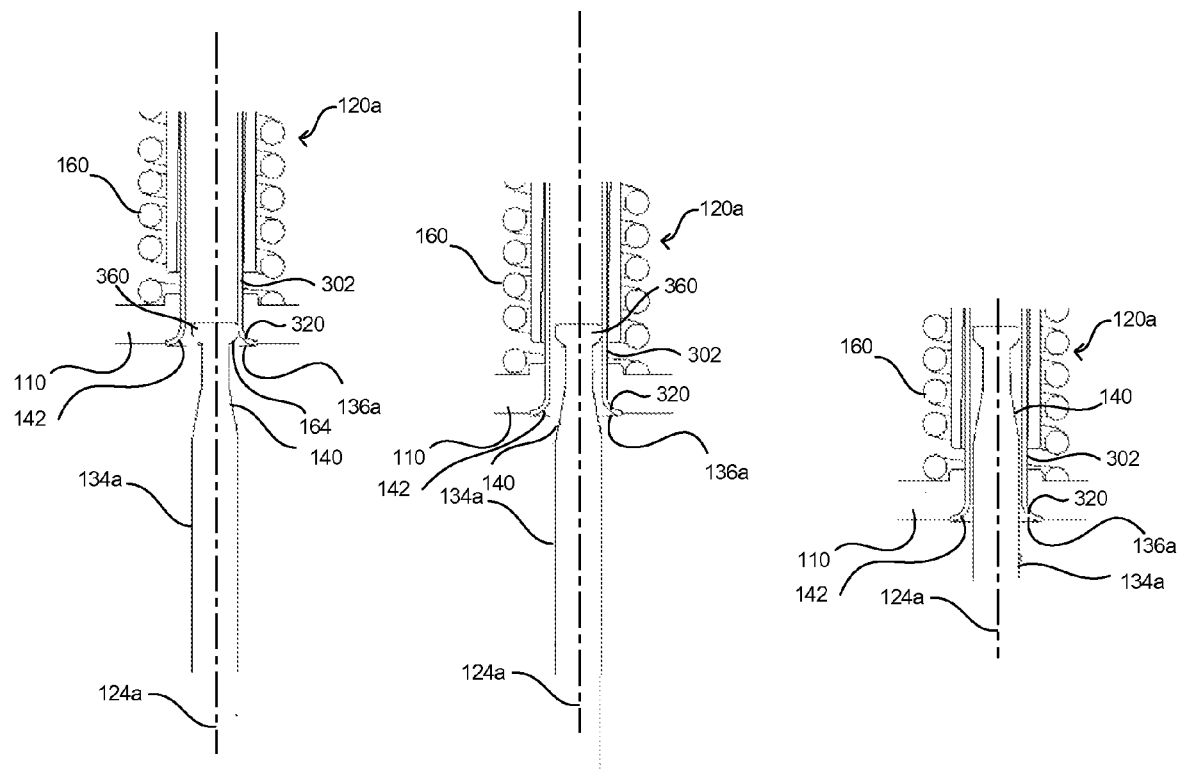
FIGS. 10a-10c are cross-sectional views of a first frame of the integrated circuit package stack of FIG. 2 being aligned with respect to a second frame of the integrated circuit package stack of FIG. 2 while loading the integrated circuit package of the stack.

In the illustrated embodiment, the first frame 110 is aligned to the second frame 112 by lowering the first frame 110 toward the second frame 112 so that alignment posts 134a, 134b (FIGS. 4, 5) which extend from the second frame 112, are inserted into alignment openings 136a, 136b, respectively, defined by the first frame 110 as depicted in FIGS. 10a-10c for the alignment post 134a and associated alignment opening 136a. FIGS. 4, 5 show the actuators 122a, 122b in an unactuated position with the pivot lever 130 in a fully open position. The first frame 110 may be lowered on the second frame 112 by a human assembler or a robotic assembler.

As best seen in the partial cross-sectional views of FIGS. 7 and 10a-10c, each alignment post 134a, 134b, has a tapered alignment surface 140 as shown for the alignment post 134a, for example. Similarly, each alignment opening 136, 136b has a tapered alignment surface 142 which is positioned to be engaged by the tapered alignment surface 140 if there is any misalignment between the alignment axes 124a, 124b of the alignment posts 134a, 134b, and the corresponding alignment openings 136a, 136b, as the alignment posts 134a, 134b (FIG. 4) which extend from the second frame 112, are inserted into alignment openings 136a, 136b.

Due to the tapering of the alignment surfaces 140, 142, the alignment between the first frame 110 and the second frame 112 may initially be relatively coarse as each alignment post 134a, 134b is initially inserted into the corresponding first frame opening 136a, 136b. However, as the first frame 110 is progressively lowered and the alignment posts 134a, 134b are progressively inserted further into the alignment openings 136a, 136b as depicted in FIGS. 10b, 10c for the alignment post 134a and alignment opening 136a, the alignment becomes progressively finer. The first frame 110 continues to the aligned position depicted in FIG. 11a in which the electrical contacts of the integrated circuit package 104 are resting on the electrical contacts of the socket 106 disposed within the second frame 112. As previously mentioned, the second frame 112 and the socket 106 are secured to the printed circuit board 102 In the aligned position depicted in FIG. 11a, the first frame 110 has not yet been latched to the second frame 112. In this manner, the first frame 110 and the second frame 112 may be precisely aligned with respect to each other along the alignment axes 124a, 124b, resulting in precise alignment of the integrated circuit package 104 and the socket 106 (and the printed circuit board 102), as well.

Once the electrical contacts of the integrated circuit package 104 are resting on the contacts of the socket 106, with the first frame 110 and the integrated circuit package aligned with respect to the socket 106 and the second frame 112 as discussed above, the first frame 110 may be released by the human or robotic assembler. In another operation, one or more biasing devices such as the biasing devices 120a, 120b, for example, may be actuated using an actuator such as an actuator 122a, 122b, for example, aligned with the associated biasing device along the associated alignment axis, to bias the first frame toward the second frame along the alignment axis and bias the integrated circuit toward the socket or substrate.

In the illustrated embodiment, each biasing device 120a, 120b includes a helix spring 160 (FIG. 2) which is positioned between the associated actuator 122a, 122b and the first frame 110. The force exerted by each spring 160 is coaxially aligned with the associated alignment axis 124a, 124b, as shown in FIG. 11a for the biasing device 122a, for example. Although the spring 160 is depicted as a helix spring, it is appreciated that other types of springs such as flat springs, for example, may be utilized as well, depending upon the particular application.

In the illustrated embodiment, each biasing device 122a, 122b includes a spring cap 300 having a barrel portion 301a (FIG. 11b) inserted into the upper end of the spring 160 so that a shoulder portion 301b engages the top of the spring 160. The lower end of the spring 160 is seated on the first frame 110 (FIG. 11a). It is appreciated that the spring cap 300 may have other shapes, depending upon the particular application.

When assembled, a preload force is applied to the first frame 110 by partially compressing the spring 160 and capturing the spring cap 300, the partially compressed spring 160 and the first frame 110 in a spring sleeve 302. As best seen in FIG. 11b, the spring sleeve 302 has a flared upper end 310 which engages a shoulder 312 of the spring cap 300. As best seen in FIG. 15a for the biasing device 120a, the spring sleeve 302 also has a flared lower end 320 which engages a shoulder 322 of the alignment opening 136a, 1326b of the first frame 110. The flared lower end 320 of the spring sleeve 302 provides the tapered surface 142 (FIGS. 10a-10c) which may be engaged by a corresponding tapered surface 140 of an alignment post 134a, 134b, as discussed above, when aligning the first and second frames 110, 112. It is appreciated that the spring sleeve 302 may have other shapes, depending upon the particular application.

Figure 12:
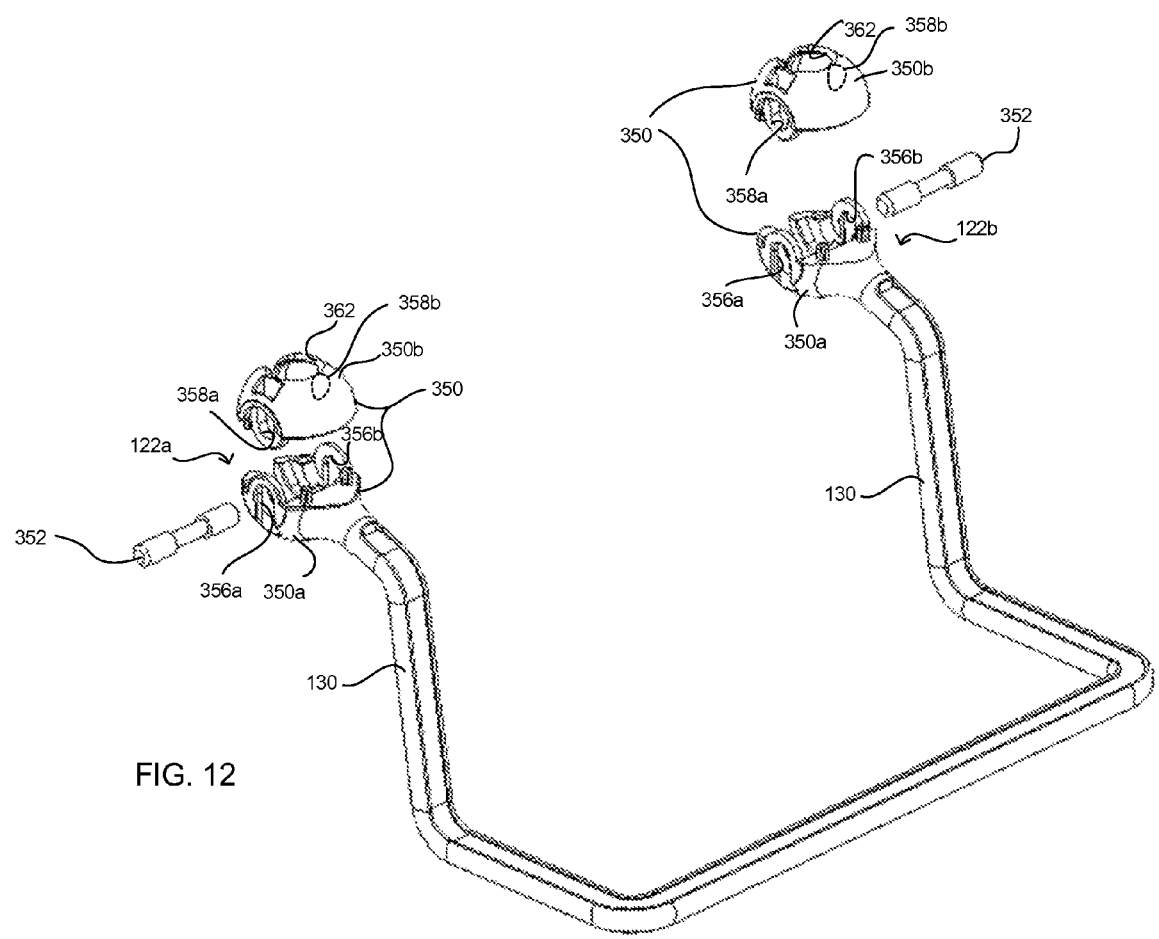
FIG. 12 is an exploded assembly view of one embodiment of a pair of actuators and a lever of the integrated circuit package stack of FIG. 2.
Figure 13:
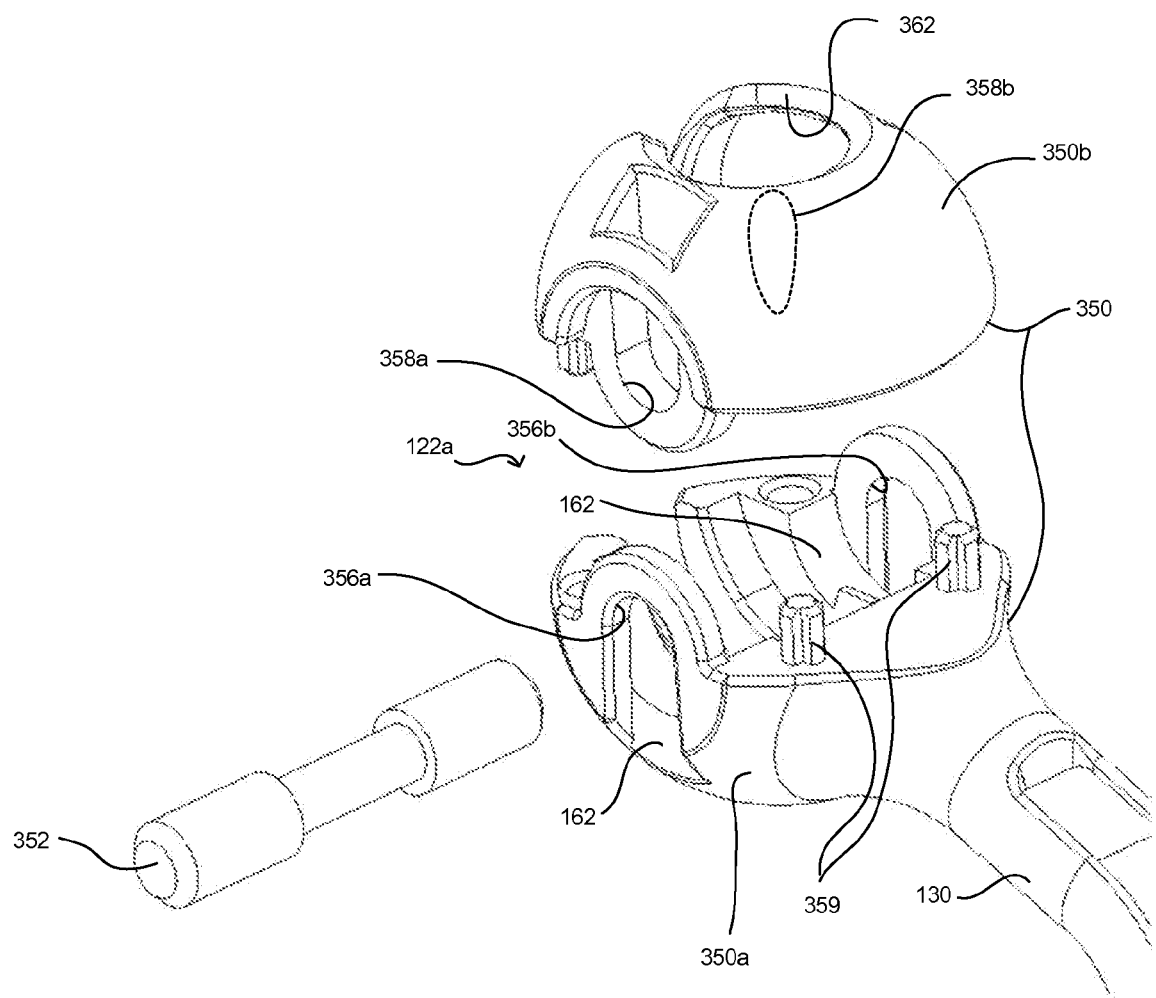
FIG. 13 is an enlarged exploded assembly view of one embodiment of an actuator of the integrated circuit package stack of FIG. 2.

As best seen in FIGS. 12 and 13, in the illustrated embodiment, each actuator 122a, 122b includes a generally ball-shaped structure 350, which are linked by the pivot lever 130. The ball-shaped structures 350 are rotatable and are each pivotally coupled by a pivot pin 352 to the associated spring cap 300 (FIGS. 11a, 11b) of the associated biasing device 120a, 120b. Thus, FIGS. 11a, 11b show the ball-shaped structure 350 of the actuator 122a pivotally coupled to the spring cap 300 of the biasing device 120a by the pivot pin 352 which defines a center pivot point 354 (FIG. 11b) of the ball-shaped structure 350. In the illustrated embodiment, the ball-shaped structure 350 is formed by assembling two generally semi-spherical portions 350a, 350b which are secured together when the pivot pin 352 is inserted into pivot pin openings 356a, 356b (FIGS. 12, 13) of the portion 350a, pivot pin openings 358a, 358b of the portion 350b and the pivot pin openings of the spring caps 300. Pins 359 extending from portion 350a are received in suitable openings of the portion 350b to further secure the portions 350a, 350b together. Although the structure 350 is depicted as being ball-shaped and an assembly of two generally semi-spherical portions 350a, 350b, it is appreciated that the actuator may have other shapes and may be formed as a unitary structure or an assembly of more portions.

As previously mentioned, in the illustrated embodiment, the first frame 110 is aligned to the second frame 112 by lowering the first frame 110 toward the second frame 112 so that alignment posts 134a, 134b (FIGS. 4, 5) which extend from the second frame 112, are inserted into alignment openings 136a, 136b, respectively, defined by the first frame 110 as depicted in FIGS. 10a-10c for the alignment post 134a. This motion continues to the aligned position depicted in FIG. 11a, in which the electrical contacts of the integrated circuit package 104 are resting on the electrical contacts of the socket 106 associated with the second frame 112 In addition, as best seen in FIG. 11b, a knob-shaped end 360 of each alignment post 134a, 134b extends into a key-hole shaped opening 362 of the ball-shaped structure of the associated actuator 122a, 122b. It is appreciated that the alignment posts 134a, 134b and the opening 362 may have other shapes, depending upon the particular application.

In the aligned position depicted in FIGS. 11a, 11b, the actuators 122a, 122b have not yet been actuated, and the first frame 110 has not yet been latched to the second frame 112. As set forth above, each actuator 122a, 122b has a rotatable wedge-shaped body 162 which defines a portion of the key-shaped opening 362. In the illustrated embodiment, each wedge-shaped body 162 defines a spiral-curved ramp surface 370, and is a part of the ball-shaped structure 350 of the associated actuator 122a, 122b. As best seen in FIG. 11b, due to the curved and inclined spiral shape of the ramp surface 370, the distance between the ramp surface 370 and the pivot center 354 gradually decreases from a maximum distance at a beginning point 380 of the ramp surface 370 to a minimum at an end point 382 of the ramp surface. It is appreciated that the body 162 and the ramp surface 370 may have other shapes, depending upon the particular application.

Thus, as best seen in FIGS. 14a, 14b, as the actuator 122a is rotated by pivoting the pivot lever 130, the curved ramp surface 370 of the wedge-shaped body 162 engages beginning at a leading edge 384 of engagement, the shoulder surface 164 defined by the knob-shaped end 360 of the alignment post 134a. Thus, at the beginning of the rotation of the ball-shaped body 350, the ramp beginning point 380 engages the post shoulder surface 164 at the leading edge 384 of engagement. As the curved ramp surface 370 of the wedge-shaped body 162 continues to rotate, the pivot center point 354 of the ball-shaped structure 350 (and the ramp surface 370), is drawn toward the alignment post 134a of the second frame 112, as the distance between the ramp surface 370 and the pivot center 354 decreases as the leading edge 384 of engagement progresses up the curved ramp surface 370.

As the pivot point 370 of the ball-shaped structure 350, is drawn toward the alignment post 134a of the second frame 112, the spring cap 300 to which the ball-shaped structure 350 is pivotally coupled, is likewise drawn toward the alignment post 134a of the second frame 112. As the spring cap 300 is drawn toward the alignment post 134a, the spring 160 is further compressed which transfers the load of the curved ramp surface 370 of the wedge-shaped body 162 engaging the shoulder surface 164 of the knob-shaped end 360 of the alignment post 134a, to the first frame 110, thereby biasing the first frame 110 towards the second frame 112.

Thus, at the beginning of the rotation of the ball-shaped structure, the leading edge 384 of engagement between the ramp surface 370 and the post shoulder 164 is at the ramp beginning point 380 and the distance between the ramp surface 370 and the pivot center 354 at the leading edge 384 of engagement is at a maximum. Hence, the transfer of the load of the curved ramp surface 370 of the wedge-shaped body 162 engaging the shoulder surface 164 of the knob-shaped end 360 of the alignment post 134a, to the first frame 110, thereby biasing the first frame 110 towards the second frame 112, is at a minimum. As best seen in FIG. 11b, the shoulder 312 of the spring cap 300 engages the spring sleeve flared upper end 310 when the biasing the first frame 110 towards the second frame 112, is at a minimum.

In the example of FIGS. 14a, 14b, rotation of the ramp surface 370 has progressed such that the leading edge 384 of engagement between the ramp surface 370 and the post shoulder 164 is at an intermediate point along the ramp surface 370 as the ball-shaped structure 350 rotates. Thus, the distance between the ramp surface 370 and the pivot center 354 at the leading edge 384 of engagement is at an intermediate value. Hence, the transfer of the load of the curved ramp surface 370 of the wedge-shaped body 162 engaging the shoulder surface 164 of the knob-shaped end 360 of the alignment post 134a, to the first frame 110 by the compression of the spring 160, thereby biasing the first frame 110 towards the second frame 112, is at an intermediate value, in the actuator position depicted in FIGS. 14a, 14b. In this position of the actuator 122a, the shoulder 312 of the spring cap 300 is displaced an intermediate distance down from the spring sleeve flared upper end 310, so that the spring cap 300 compresses the spring 160 by an intermediate value, such that the biasing the first frame 110 towards the second frame 112, is at an intermediate value.

Returning to FIG. 9 which depicts one example of operations for installing an integrated circuit package on a printed circuit board or other substrate, in accordance with one embodiment of the present description, in another operation, the first and second frames are latched (block 234) together when biased towards each other with the integrated circuit package and the substrate biased toward each other. In the example of FIGS. 15a, 15b, the ball-shaped structure 350 has been rotated until the leading edge 384 of engagement between the ramp surface 370 and the post shoulder 164 is at the end point 382 of the ramp surface 370. Thus, the distance between the ramp surface 370 and the pivot center 354 at the leading edge 384 of engagement is at a minimum value. Hence, the transfer of the load of the curved ramp surface 370 of the wedge-shaped body 162 engaging the shoulder surface 164 of the knob-shaped end 360 of the alignment post 134a, by the compression of the spring 160, thereby biasing the first frame 110 towards the second frame 112, is at a maximum value in the actuator position depicted in FIGS. 15a, 15b. In this position of the actuator 122a, the shoulder 312 of the spring cap 300 is displaced a maximum distance down from the spring sleeve flared upper end 310, so that the spring cap 300 compresses the spring 160 by a maximum value, such that the biasing of the first frame 110 towards the second frame 112, is at a maximum value.

In this manner, the load exerted by pivoting the lever 130 is effectively transferred to the knob-shaped ends 360 of the alignment posts 134a, 134b, with a relatively short actuation motion. In FIG. 15a, the full load is being applied to the knob-shaped end 360 of the alignment posts 134a, 134b, compressing the integrated circuit package 104 into the socket 106 and applying a suitable load onto the heat sink 126 as well via the first frame 110 for suitable thermal performance of the heat sink.

In one aspect of the present description, the compression of spring 160 from an initial position of compression depicted in FIG. 11a to a position of increased compression depicted in FIG. 15a, provides a relatively small degree of travel. In the illustrated embodiment, the spring 160 is relatively long in the free state, and compressed a significant distance by the assembly of the spring, spring sleeve and spring cap as discussed above. As a result of this assembly, a suitable preload is present prior to actuating the lever 130. In the illustrated embodiment, actuating the lever 130 provides relatively little additional spring compression, while transferring the preload plus the incremental load to the alignment post shoulder. Since the preload is such a high percentage of the total spring compression, it is believed that a relatively high and predictable load may be achieved with relatively little added compression of the spring as the lever 130 is actuated. In rotating the lever 130 approximately 180 degrees of rotation from the position depicted in FIG. 11a, to the position depicted in FIG. 15a, it is believed that the force that the operator exerts to transfer the force to the alignment post shoulder is relatively small, particularly when viewed on the basis of the force exerted per degree of rotation of the lever 130. As a result, a relatively soft spring may be used to provide a suitably high amount of bias force applied to the first frame 110 as shown in FIG. 15a, in a relatively constrained space.

In addition, in the illustrated embodiment, the body 162 has at the end 382 of the ramp surface 370, a relatively flat portion 390 which engages the post shoulder surface 164 relatively evenly around the circumference of the alignment post 134a. Thus, when the lever 130 is fully rotated as shown in FIG. 7, the actuator 122a is latched in the position depicted in FIG. 15a, 15b. The actuator 122a may be released, thereby releasing the first frame 110 from the second frame by reversing the pivoting of the lever described above. The actuator 122b operates in a similar manner to actuate the biasing device 120b as the lever 130 is pivoted as shown in FIGS. 11b, 14b and 15b.

In some embodiments, the latching surface portion 390 may have a slight reverse incline to permit the compression of the spring 160 to slightly relax. Hence, to reverse the lever 130, the slight relaxation of the spring 160 would be reversed to provide a further latching action to the position depicted in FIG. 15a, 15b. In addition, in some embodiments, a portion 130a of the lever 130 may be latched to the second frame 112 using a clip or other mechanism to deter inadvertent unlatching of the actuators 122a, 122b.

Additional Embodiment Details

In certain embodiments, the stack embodiments may be embodied in a computer system including a video controller to render information to display on a monitor coupled to a computer system comprising a desktop, workstation, server, mainframe, laptop, handheld computer, etc. Alternatively, the stack embodiments may be embodied in a computing device that does not include a video controller, such as a switch, router, etc.

The illustrated operations of FIG. 9 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 2:
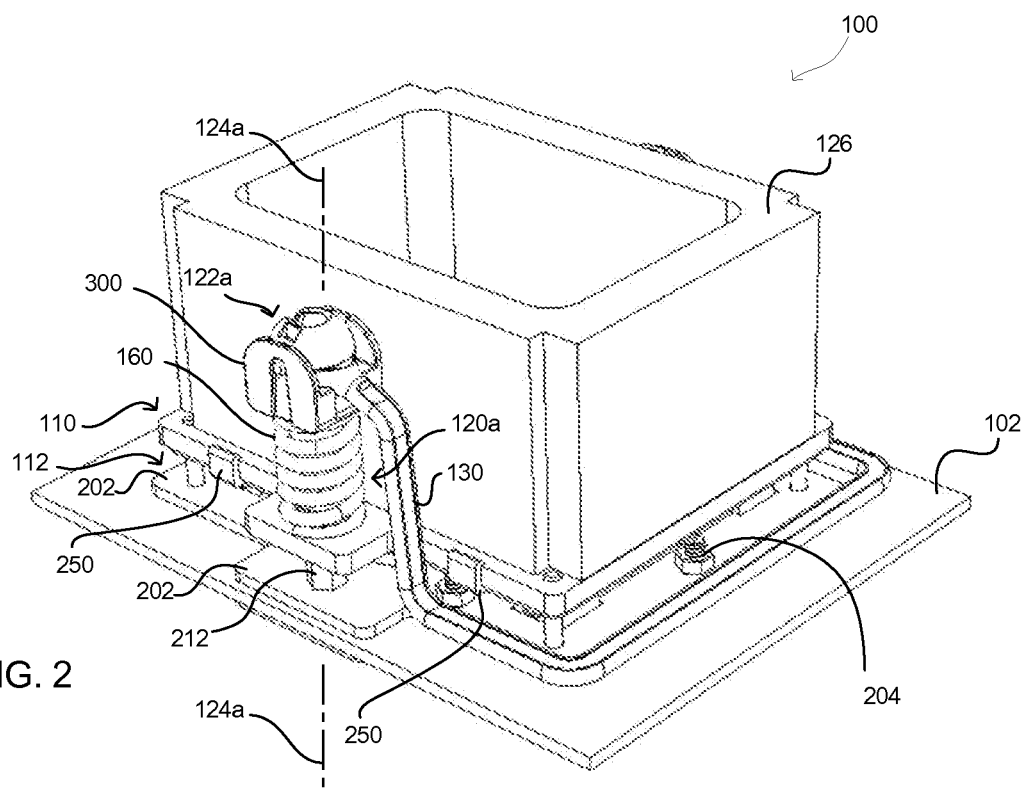
FIG. 2 illustrates an installed integrated circuit package stack in accordance with one embodiment of the present description.
Figure 16:
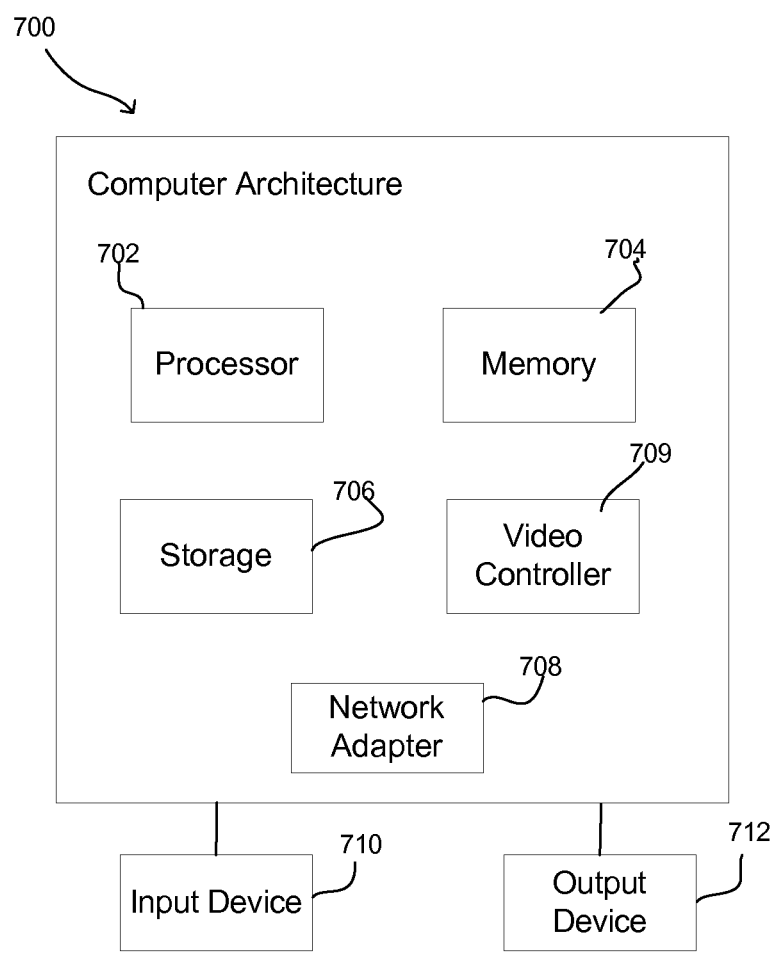
FIG. 16 illustrates an example of an architecture that may be used with the described embodiments.

FIG. 16 illustrates one embodiment of a computer architecture 700 which can utilize components, such the device 100 shown in FIG. 2. One or more components or devices may utilize an integrated assembly for installing an integrated circuit package on a substrate in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art or subsequently developed. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art or subsequently developed. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a stack in accordance with the description provided herein. Thus, stack embodiments may be embodied in computer systems or other systems in which a stack in accordance with the present description is mounted on one or both of a motherboard and an expansion card. Accordingly, in some system embodiments, the system may lack an expansion card, and a stack in accordance with the present description may be mounted on a motherboard. In another system embodiment, a stack in accordance with the present description may be mounted on an expansion card but not on a motherboard.

The foregoing description of various embodiments has been presented for the purposes of illustration and explanation. It is not intended to be exhaustive or to limit to the precise form disclosed. Many modifications and variations are possible in light of the above teaching.

What is claimed is:

1. A device for an integrated circuit device and a substrate, comprising:
   a first frame;
   a second frame defining a first alignment axis and adapted to be attached to the substrate;
   a first biasing device aligned with the first alignment axis and positioned to engage the first frame;
   a first actuator aligned with the first alignment axis, to actuate the first biasing device, to bias the first frame toward the second frame in alignment with the alignment axis and bias the integrated circuit device toward the substrate; and
   a latch adapted to latch the first actuator with the first and second frames aligned with and biased towards each other in alignment with the first alignment axis, and the integrated circuit device and the substrate aligned with and biased toward each other;
   wherein said second frame has a first alignment post which defines said first alignment axis extending from the second frame to the first frame, wherein the first frame defines an alignment opening, and wherein the first alignment post is adapted to extend through the first frame first alignment opening; and
   wherein the biasing device includes a first spring positioned between the first actuator and the first frame and coaxially aligned with the first alignment axis, wherein the first actuator includes a rotatable body having a curved ramp surface, wherein the first alignment post has a first shoulder surface, wherein rotation of the actuator body causes the curved ramp surface of the body of the first actuator to engage the first shoulder surface defined by the first alignment post, to compress the first spring, which biases the first frame toward the second frame and biases the integrated circuit toward the substrate.

2. The device of claim 1 wherein said first frame has an alignment surface of the first alignment opening in said first frame, and wherein said alignment post of said second frame has a tapered alignment surface adapted to engage the alignment surface of the first alignment opening of the first frame so that so that the first alignment opening in said first frame is aligned with said first alignment axis defined by said first alignment post.

3. The device of claim 1 wherein the second frame further defines a second alignment axis, the device further comprising:
   a second biasing device aligned with the second alignment axis and positioned to engage the first frame;
   a second actuator aligned with the second alignment axis, to actuate the second biasing device, to bias the first frame toward the second frame in alignment with the second alignment axis and bias the integrated circuit device toward the substrate; and
   a latch adapted to latch the second actuator with the first and second frames biased towards each other in alignment with the second alignment axis, and the integrated circuit device and the substrate biased toward each other.

4. The device of claim 3 further comprising a pivotable lever coupled to both said first and second actuators to actuate both said first and second actuators in unison as the lever pivots.

5. The device of claim 3 wherein the first frame has a heat sink having a bi-lateral center line and wherein the first and second alignment axes are aligned with the bi-lateral center line of the heat sink when the first frame and the integrated circuit device, are aligned with the second frame carried on a substrate, along the respective first and second alignment axes extending from the second frame to the first frame.

6. The device of claim 1 wherein the first alignment post has a knob-shaped end which defines said first shoulder surface.

7. The device of claim 1 wherein said first actuator includes a rotatable ball-shaped structure which includes the body having the curved ramp surface of the first actuator.

8. The device of claim 7 wherein the ball-shaped structure defines a key-hole shaped opening wherein the knob-shaped end of the first alignment post is adapted to be inserted into the key-hole shaped opening defined by the ball-shaped structure.

9. The device of claim 1 wherein the first spring of the first biasing device includes a first helical spring and wherein the first biasing device further includes a first spring cap disposed within the first helical spring at one end and pivotally supporting the first actuator at the other end, and having a first shoulder positioned to engage and compress the spring as the first actuator is pivoted.

10. The device of claim 9 wherein the first helical spring encircles the alignment first alignment post.

11. The device of claim 9 wherein the spring cap of the first biasing device further includes a second shoulder and the first alignment opening of the first frame includes a shoulder, and wherein the first biasing device further includes a first spring sleeve having first and second ends wherein the first end of the first spring sleeve is flared to engage the second shoulder of the first spring cap and the second end of the first spring sleeve is flared to engage the shoulder of the first frame first alignment opening to compress and preload the helical spring between the spring cap first shoulder and the first frame first opening.

12. The device of claim 1 wherein the substrate is a printed circuit board having a socket to receive the integrated circuit device, wherein the latch is adapted to latch the first actuator with the first and second frames aligned with and biased towards each other in alignment with the first alignment axis, and the integrated circuit device and the socket aligned with and biased toward each other.

13. A system, comprising:
a motherboard having a socket on the motherboard;
at least one system memory;
a first frame;
a second frame disposed on the motherboard and defining a first alignment axis;
a processor disposed in the socket between the first and second frames;
a first biasing device aligned with the first alignment axis and positioned to engage the first frame;
a first actuator aligned with the first alignment axis, to actuate the first biasing device, to bias the first frame toward the second frame in alignment with the alignment axis and bias the processor toward the socket and the motherboard; and
a latch adapted to latch the first actuator with the first and second frames aligned with and biased towards each other in alignment with the first alignment axis, and the processor and the socket aligned with and biased toward each other;
an expansion card coupled to said motherboard; and
a controller disposed on said expansion card;
wherein:
said second frame has a first alignment post which defines said first alignment axis extending from the second frame to the first frame, wherein the first frame defines an alignment opening, and wherein the first alignment post is adapted to extend through the first frame first alignment opening; and
the biasing device includes a first spring positioned between the first actuator and the first frame and coaxially aligned with the first alignment axis, wherein the first actuator includes a rotatable body having a curved ramp surface, wherein the first alignment post has a first shoulder surface, wherein rotation of the actuator body causes the curved ramp surface of the body of the first actuator to engage the first shoulder surface defined by the first alignment post, to compress the first spring, which biases the first frame toward the second frame and biases the integrated circuit toward the substrate.

* * * * *